United States Patent
Kulkarni et al.

(10) Patent No.: US 9,830,965 B2
(45) Date of Patent: Nov. 28, 2017

(54) MULTIPLE-HOT (MULTI-HOT) BIT DECODING IN A MEMORY SYSTEM FOR ACTIVATING MULTIPLE MEMORY LOCATIONS IN A MEMORY FOR A MEMORY ACCESS OPERATION

(71) Applicant: QUALCOMM Incorporated, San Diego, CA (US)

(72) Inventors: Milind Ram Kulkarni, Raleigh, NC (US); David Paul Hoff, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/087,219

(22) Filed: Mar. 31, 2016

(65) Prior Publication Data
US 2017/0053685 A1    Feb. 23, 2017

Related U.S. Application Data

(60) Provisional application No. 62/206,229, filed on Aug. 17, 2015.

(51) Int. Cl.
*G11C 8/10* (2006.01)
*G11C 8/18* (2006.01)

(52) U.S. Cl.
CPC . *G11C 8/10* (2013.01); *G11C 8/18* (2013.01)

(58) Field of Classification Search
CPC .. G11C 8/10; G11C 8/18; G06F 12/10; G06F 12/02
See application file for complete search history.

(56) References Cited

U.S. PATENT DOCUMENTS

| | | | |
|---|---|---|---|
| 5,469,384 A | 11/1995 | Lacey | |
| 6,199,151 B1* | 3/2001 | Williams | G06F 12/06 711/203 |
| 6,246,347 B1 | 6/2001 | Bakhmutsky | |
| 6,496,947 B1* | 12/2002 | Schwarz | G11C 29/12015 714/30 |
| 6,570,946 B1 | 5/2003 | Homol et al. | |
| 7,555,688 B2 | 6/2009 | Alvamani et al. | |
| 2006/0236176 A1* | 10/2006 | Alyamani | G01R 31/31854 714/726 |

(Continued)

*Primary Examiner* — Douglas King
(74) *Attorney, Agent, or Firm* — W&T/Qualcomm

(57) ABSTRACT

Multiple-hot (multi-hot) bit decoding in a memory system for activating multiple memory locations in a memory for a memory access operation are disclosed. In one aspect, a multi-hot bit decoding system is provided that includes a memory access control system that includes a decoder. The decoder is configured to decode an address for a memory access operation into a single-hot bit decode word for activating a memory row at the encoded address. To automatically access another memory row(s) for a memory access operation, the memory access control system also includes a mapping circuit configured to provide an additional decode word(s) for activating another memory row(s) based on the address. The decode word and additional decode word(s) are merged to provide a multi-hot bit decode word that is asserted onto a decode wordline such that multiple memory rows are activated for a memory access operation.

24 Claims, 10 Drawing Sheets

(56) References Cited

U.S. PATENT DOCUMENTS

| | | | |
|---|---|---|---|
| 2009/0168523 A1* | 7/2009 | Shirakawa | G11C 16/20 365/185.09 |
| 2011/0072205 A1* | 3/2011 | Lee | G11C 29/08 711/105 |
| 2013/0042089 A1 | 2/2013 | Vinh et al. | |
| 2014/0241359 A1* | 8/2014 | Bosshart | H04L 45/74 370/392 |

* cited by examiner

MULTIPLE-HOT (MULTI-HOT) BIT DECODING IN A MEMORY SYSTEM FOR ACTIVATING MULTIPLE MEMORY LOCATIONS IN A MEMORY FOR A MEMORY ACCESS OPERATION

PRIORITY APPLICATION

The present application claims priority under 35 U.S.C. §119(e) to U.S. Provisional Patent Application Ser. No. 62/206,229, filed on Aug. 17, 2015, and entitled "MEMORY SYSTEMS EMPLOYING A MULTIPLE-HOT BIT DECODING SYSTEM FOR ACTIVATING MULTIPLE MEMORY LOCATIONS IN A MEMORY FOR THE SAME MEMORY ACCESS OPERATION," which is incorporated herein by reference in its entirety.

BACKGROUND

I. Field of the Disclosure

The technology of the disclosure relates generally to accessing memory in a processor-based system, and more particularly to decoding systems provided in a memory system for decoding an address in a memory access operation to access a memory row in a memory associated with the address.

II. Background

Processor-based systems include one or more central processing units (CPUs) or other processors that utilize memory for data storage for varying types of system operations and purposes. For example, system memory is provided for data storage and to store program code for storing instructions to be executed. Cache memory may be provided as fast random access memory (RAM) for storing a portion of main memory to avoid longer latency accesses to system memory. Memory buffers are also commonly employed in a processor-based system for storing and controlling the flow of data. For example, a memory buffer may be provided in the form of a first-in, first-out (FIFO) buffer or list. As an example, a FIFO buffer may be employed in instruction pipelines in processors for storing processed instructions in various stages towards execution.

In this regard, a conventional memory system includes a memory array that comprises a plurality of memory rows. Each memory row includes a plurality of bit cells for storing data. To index a memory row in the memory array for a memory access operation (e.g., a memory read or write operation), an encoded address is provided as part of the memory access request. The encoded address is decoded by a decode circuit. The decode circuit outputs a pre-decoded address onto a plurality of decode wordlines such that one of the decode wordlines is activated as a single "hot bit." Each memory row includes a logic circuit(s) that taps off of the decode wordlines such that a memory row is activated based on the decode wordlines containing the desired hot bit to activate the memory row.

To increase read performance of such a memory system, it may be desired to configure the memory system to automatically read adjacent addresses (i.e., memory rows) in the memory array for applications where it is likely that subsequent read operations will be directed to sequential addresses. In this regard, when a requested encoded address for a read operation is provided to activate a memory row at the encoded address, the memory system can be configured to automatically activate a sequential memory row to be read from the memory array simultaneously as part of a single read operation. However, the addresses in the memory array may not be physically organized in a sequential manner. For example, sequential logical addresses may correspond to interleaved or otherwise separated memory rows in the memory array. In this regard, the logic circuits for the memory rows can be configured to tap the pre-decode wordlines such that a memory row is activated when a sequential logical address is addressed. However, the logic circuits provided for each memory row to allow a memory row to be activated by more than one logical address cause the memory rows to increase in area.

To address this issue, the decoding of the encoded address can be provided among a plurality of partial decoders. A pre-decoded address is first partially decoded into a single-hot bit provided onto a plurality of pre-decode wordlines. Final row decoder circuits are provided for each respective memory row that tap off the pre-decode wordlines to perform the final decoding of the pre-decoded address for activating its respective memory row. However, multiple final row decoder circuits have to be provided for each memory row and be tapped of the pre-decode wordlines if each memory row can be activated by more than one logical address. This increases wiring and routing complexity for the memory rows. Further, providing additional final row decoder circuits for each memory row that are tapped on the pre-decode wordlines increases gate capacitance and memory row access latency as a result.

SUMMARY OF THE DISCLOSURE

Aspects disclosed herein include multiple-hot (multi-hot) bit decoding in a memory system for activating multiple memory locations in a memory for a memory access operation. For example, a memory location may be a memory row that includes one or more bit cells for storing a data word. In certain aspects herein, a multi-hot bit decoding system is provided that is configured to receive an encoded address as part of a memory access operation for accessing a memory location (e.g., a memory row) in a memory array corresponding to the encoded address. The multi-hot bit decoding system includes a memory access control system that controls access to the memory locations in the memory array. In this regard, the memory access control system includes a decoder. The decoder is configured to decode the encoded address into a single-hot bit decode word for activating the memory location in a memory array at the encoded address. To automatically access another memory location(s) for a memory access operation, the memory access control system also includes a mapping circuit. The mapping circuit is configured to translate the single-hot bit decode word to provide one or more additional decode words for activating another memory location(s) based on the encoded address. The single-hot bit decode word and the additional decode word(s) are merged in a merge circuit in the memory access control system to provide a multi-hot bit decode word that is asserted onto a decode wordline. Access logic for each memory location in the memory array taps off the multi-hot bit decode word such that each memory location can be activated for multiple encoded addresses. In this manner, the logic for decoding the encoded address into additional memory locations is provided in the memory access control system, which is common to all memory locations, as opposed to replicating this decoding logic for each memory location at a higher area cost, routing complexity, and/or increased memory access latency.

In this regard, in one aspect, a multi-hot bit decoding system for activating memory locations in a memory for a memory access operation is provided. The multi-hot bit decoding system comprises a decoder. The decoder is configured to receive an encoded address for a memory access operation and decode the encoded address into a single-hot bit decode word corresponding to a memory row among a plurality of memory rows in a memory array corresponding to the encoded address. The multi-hot bit decoding system also comprises a mapping circuit. The mapping circuit is configured to translate the single-hot bit decode word into one or more additional single-hot bit decode words corresponding to one or more other memory rows among the plurality of memory rows in the memory array not corresponding to the encoded address. The multi-hot bit decoding system also comprises a merge circuit. The merge circuit is configured to merge the single-hot bit decode word and the one or more additional single-hot bit decode words into a multi-hot bit decode word asserted onto a multi-hot bit decode wordline. The multi-hot bit decode wordline is configured to be accessed by a memory row access system to activate two or more memory rows among the plurality of memory rows based on the multi-hot bit decode word on the multi-hot bit decode wordline.

In another exemplary aspect, a multi-hot bit decoding system for activating memory locations in a memory for a memory access operation is provided. The multi-hot bit decoding system comprises means for receiving an encoded address for a memory access operation. The multi-hot bit decoding system also comprises means for decoding the encoded address into a single-hot bit decode word corresponding to a memory row among a plurality of memory rows in a memory array corresponding to the encoded address. The multi-hot bit decoding system also comprises means for translating the single-hot bit decode word into one or more additional single-hot bit decode words corresponding to one or more other memory rows among the plurality of memory rows in the memory array not corresponding to the encoded address. The multi-hot bit decoding system further comprises means for merging the single-hot bit decode word and the one or more additional single-hot bit decode words into a multi-hot bit decode word asserted onto a multi-hot bit decode wordline to be accessed to activate two or more memory rows among the plurality of memory rows in the memory array based on the multi-hot bit decode word on the multi-hot bit decode wordline.

In another exemplary aspect, a method for activating multiple memory locations in a memory for a memory access operation is provided. The method comprises decoding an encoded address for a memory access operation into a single-hot bit decode word corresponding to a memory row in a memory array corresponding to the encoded address. The method also comprises translating the single-hot bit decode word into one or more additional single-hot bit decode words corresponding to one or more other memory rows in the memory array not located at the encoded address. The method also comprises merging the single-hot bit decode word and the one or more additional single-hot bit decode words into a multi-hot bit decode word. The method also comprises asserting the multi-hot bit decode word onto a multi-hot bit decode wordline to be accessed to activate a plurality of memory rows in the memory array based on the multi-hot bit decode word on the multi-hot bit decode wordline.

DETAILED DESCRIPTION

Figure 1:
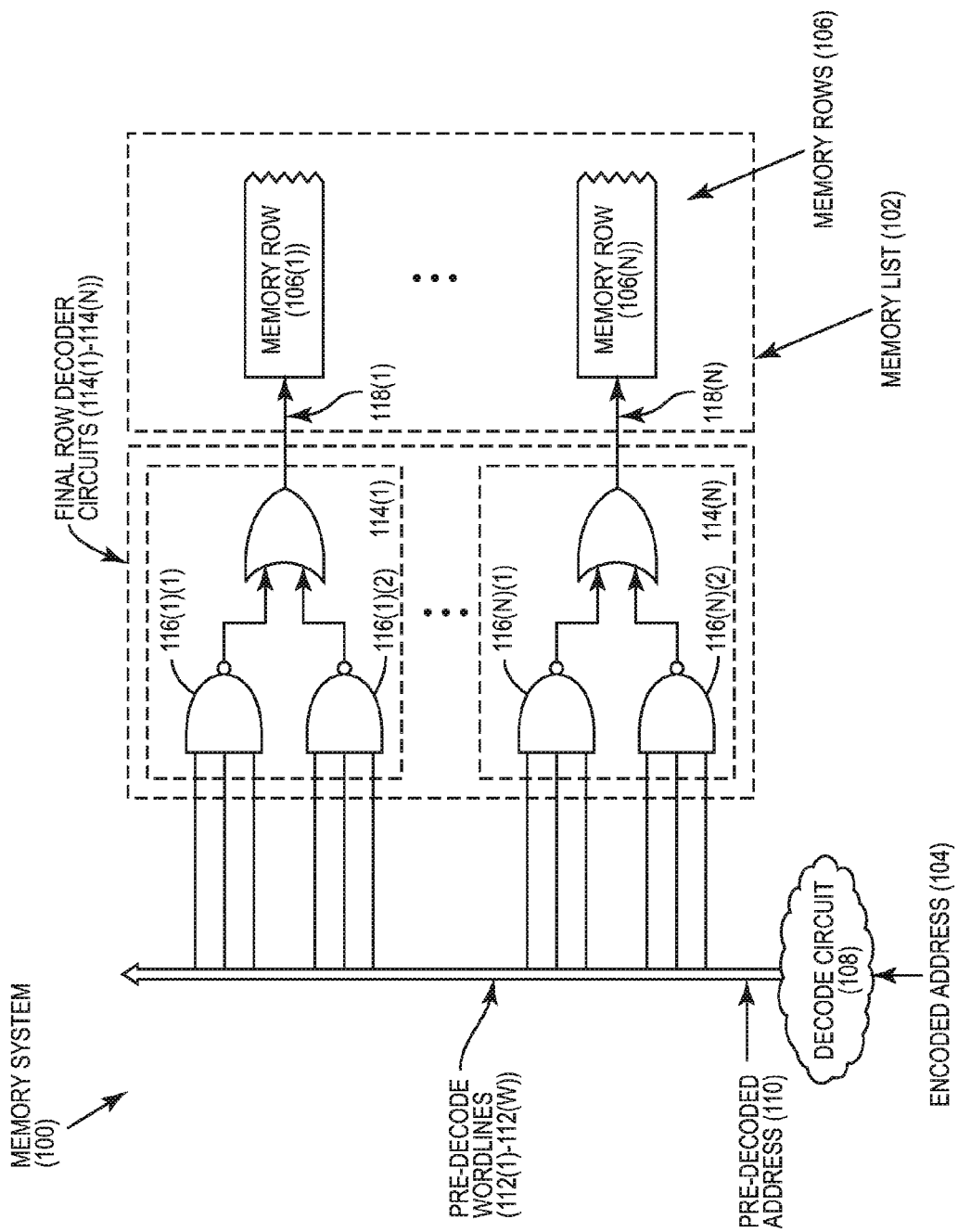
FIG. 1 is a block diagram of an exemplary memory system employing a partial decoding system with global pre-decode wordlines used to activate multiple memory rows in a memory array based on a single logical encoded address.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include multiple-hot (multi-hot) bit decoding in a memory system for activating multiple memory locations in a memory for a memory access operation. Before discussing exemplary aspects of multi-hot bit decoding in a memory system for activating multiple memory locations in a memory for a memory access operation, starting at FIG. 2, an exemplary single-hot bit decoding system for activating multiple memory locations in a memory for a memory access operation is first discussed with regard to FIG. 1.

In this regard, FIG. 1 is an example of a memory system 100 that includes a memory shown as memory list 102 for storing data. Data in the memory list 102 is accessed using an encoded address 104 as part of a memory access request. The encoded address 104 maps to a memory row 106(1)-106(N) comprised of a plurality of bit cells for storing data. To index a memory row 106(1)-106(N) at the encoded address 104, the encoded address 104 is decoded by a decode circuit 108. In this example, the decode circuit 108 is a partial decode circuit that partially decodes the encoded address 104 to simplify decoding circuitry. The decode circuit 108 outputs a pre-decoded address 110 onto a plurality of pre-decode wordlines 112(1)-112(W). Final row decoder circuits 114(1)-114(N) are provided for each respective memory row 106(1)-106(N) to perform the final decoding of the pre-decoded address 110 for activating its respective memory row 106(1)-106(N). Each final row decoder circuit 114(1)-114(N) taps off of multiple partial pre-decode wordlines 112(1)-112(W) each having one (1) hot bit according to the partial pre-decoding scheme employed in the decode circuit 108, to activate the corresponding memory row 106(1)-106(N). In this example, each final row decoder circuit 114(1)-114(N) includes multiple logic circuits 116(1)(1)-116(N)(2) so that a respective memory row 106(1)-106(N) can be activated based on multiple encoded addresses 104. In this regard, each logic circuit 116(1)(1)-116(N)(2) taps off multiple partial pre-decode wordlines 112(1)-112(W) to control which pre-decoded addresses 110 activate a respective memory row 106(1)-106(N). The results of the multiple logic circuits 1160(1)-1160(2) in each final row decoder circuit 114(1)-114(N) are OR'ed together to generate an enable output 118(1)-118(N) for each respective memory row 106(1)-106(N).

To increase read performance of the memory system 100, it may be desired to configure the memory system 100 to automatically read adjacent addresses (i.e., memory rows 106(1)-106(N)) from the memory list 102 for applications where it is likely that subsequent read operations will be directed to sequential addresses. In this regard, when a requested encoded address 104 for a read operation is provided to activate a memory row 106(1)-106(N) at the encoded address 104, the memory system 100 can be configured to automatically activate a sequential memory row 106(1)-106(N) to be read from the memory list 102 simultaneously as well as part of a single read operation. However, the addresses in the memory list 102 may not be physically organized in a sequential manner. For example, sequential logical addresses may correspond to interleaved or otherwise separated memory rows 106(1)-106(N) in the memory list 102. In this regard, each of the final row decoder circuits 114(1)-114(N) can be designed to generate an enable state on its corresponding enable output 118(1)-118(N) based on multiple pre-decoded addresses 110 based on the respective logic circuit 116(1)(1)-116(N)(2) therein and their taps to the pre-decode wordlines 112(1)-112(W).

While providing a single, global pre-decode wordline 112(1)-112(W) requires less wire routing to the memory rows 106(1)-106(N) than multiple global pre-decode wordlines 112(1)-112(W), the memory rows 106(1)-106(N) still increase in area proportional to the number of memory rows 106(1)-106(N) that are activated for a single memory address in an undesirable manner. Also, the loading of the logic circuits 116(1)(1)-116(N)(2) from the final row decoder circuits 114(1)-114(N) on the pre-decode wordlines 112(1)-112(W) increases gate capacitance, and memory row 106(1)-106(N) access latency as a result. Further, multiple accessed memory rows 106(1)-106(N) located at logically sequential addresses may be in physically separated memory rows 106(1)-106(N). In this manner, each of the respective final row decoder circuits 114(1)-114(N) for the memory rows 106(1)-16(N) must tap off of the pre-decode wordlines 112(1)-112(W), thus further increasing wiring and routing complexity for the memory rows 106(1)-106(N).

To address these issues, aspects disclosed herein include multiple-hot (multi-hot) bit decoding in a memory system for activating multiple memory locations in a memory for a memory access operation. In this regard, as discussed in the exemplary aspect below, a multi-hot bit decoding system is provided that includes a memory access control system including a decoder. The decoder is configured to decode an encoded address into a single-hot bit decode word for activating a memory location in a memory array at the encoded address. To automatically access another memory location(s) for a memory access operation, the memory access control system also includes a mapping circuit. The mapping circuit is configured to translate (e.g., shift) the single-hot bit decode word to provide one or more additional decode words for activating another memory location(s) based on the encoded address. The single-hot bit decode word and the additional decode word(s) are merged in a merge circuit in the memory access control system to provide a multi-hot bit decode word that is asserted onto a decode wordline. Access logic for each memory location in the memory array taps off the multi-hot bit decode word such that each memory location can be activated for multiple encoded addresses. In this manner, the logic for decoding the encoded address into additional memory locations is provided in the memory access control system, which is common to all memory locations, as opposed to replicating this decoding logic for each memory location at a higher area cost, routing complexity, and/or increased memory access latency.

Figure 2:
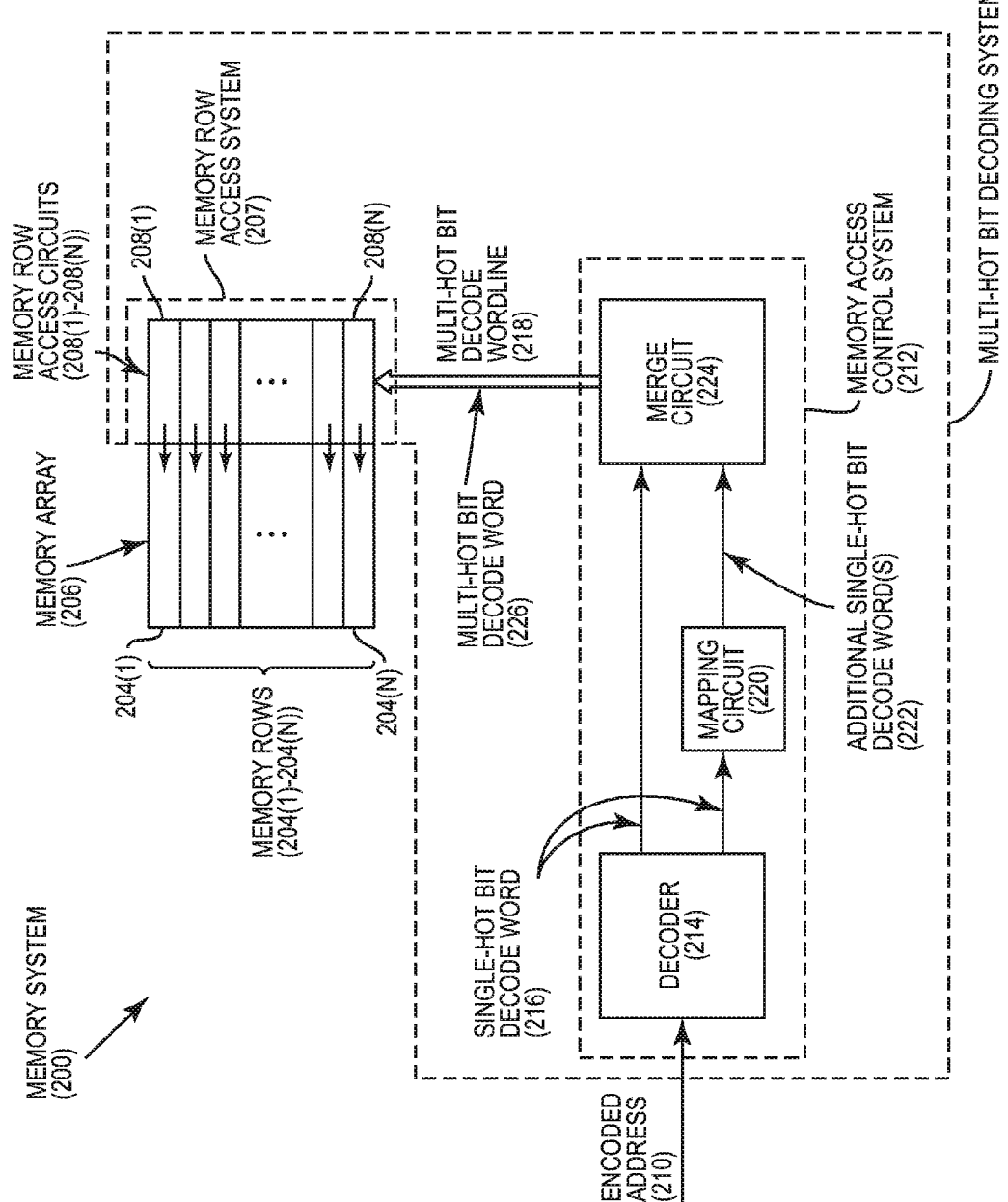
FIG. 2 is a block diagram of an exemplary memory system employing a multiple-hot (multi-hot) bit decoding system for activating multiple memory rows in a memory for a memory access operation, wherein the multi-hot bit decoding system includes a mapping circuit configured to translate a single-hot bit decode word to provide a multi-hot bit decode word for activating multiple memory rows for a memory access operation.

In this regard, FIG. 2 is a block diagram of an exemplary memory system 200 employing a multiple-hot (multi-hot) bit decoding system 202 for activating multiple memory rows 204(1)-204(N) in a memory array 206 for a memory access operation. The memory rows 204(1)-204(N) each comprise one or more bit cells such that each memory row 204(1)-204(N) can store data. A memory row access system 207 is provided in the memory array 206 to control access to the memory rows 204(1)-204(N) for a memory access operation (i.e., reading and writing operations). In this example, the memory row access system 207 comprises a plurality of memory row access circuits 208(1)-208(N) are provided for each respective memory row 204(1)-204(N) to control access to the memory row 204(1)-204(N) for a memory access operation (i.e., reading and writing operations). As will be discussed in more detail below, the memory row access circuits 208(1)-208(N) are configured to activate their corresponding memory row 204(1)-204(N) in response to a logical address provided in a memory access operation designating the location in the memory array 206 to be accessed.

In this regard, in response to a memory access operation (i.e., a read or write operation) for access to the memory array 206, an encoded address 210 is provided to the memory system 200. The encoded address 210 contains the logical address location of the memory row 204(1)-204(N)

to be accessed for the memory access operation. The encoded address 210 is decoded so that the correct physical memory row 204(1)-204(N) in the memory array 206 can be activated for the memory access operation. In this regard, the encoded address 210 is provided to the multi-hot bit decoding system 202. The multi-hot bit decoding system 202 includes a memory access control system 212 that decodes the encoded address 210 for access to any of the memory rows 204(1)-204(N) in the memory array 206. The memory access control system 212 includes a decoder 214. The decoder 214 is configured to receive the encoded address 210 and decode the encoded address 210 into a single-hot bit decode word 216 corresponding to a memory row 204(1)-204(N) in the memory array 206.

Figure 3:
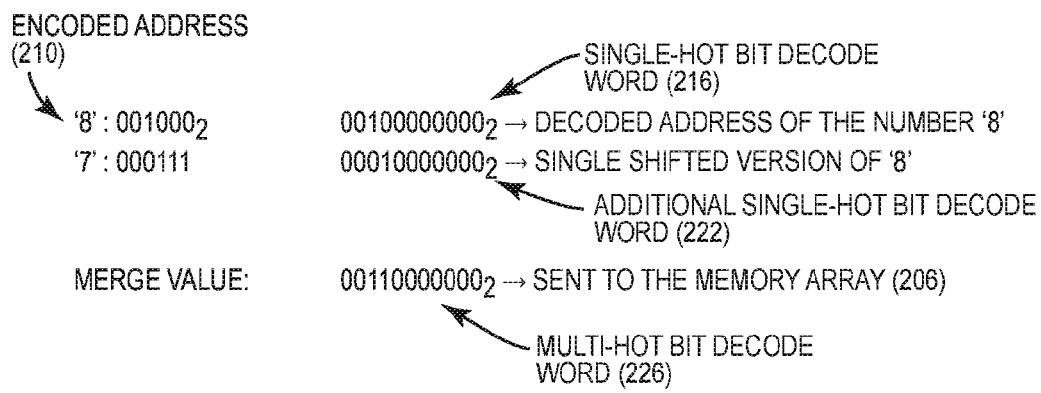
FIG. 3 illustrates an exemplary encoded address decoded into a single-hot bit decode word and translated to form an additional single-hot bit decode word(s) in the multi-hot bit decoding system in FIG. 2, to generate a multi-hot bit decode word for activating multiple memory rows in the memory for a memory access operation.

For example, as shown in FIG. 3, if the encoded address 210 is address '8' ("$001000_2$"), the decoder 214 decodes the encoded address 210 to "$00100000000_2$" as the single-hot bit decode word 216. In this manner, if only the memory row 204(1)-204(N) at address '8' were to be accessed in the memory array 206, the single-hot bit decode word 216 could be asserted onto a multi-hot bit decode wordline 218. The multi-hot bit decode wordline 218 comprises a plurality of decode wordlines each configured to be activated for a hot bit or not be activated. The memory row access circuits 208(1)-208(N) include logic that taps off of the multi-hot bit decode wordline 218 according to a decoded version of the encoded address 210 and are configured to activate a corresponding memory row 204(1)-204(N) for the memory access operation. For example, if physical memory row 204(4) in the memory array 206 is designed in the memory system 200 to correspond to logical address '8,' the memory row access circuit 208(4) contains logic that is designed to activate the corresponding memory row 204(4) if the single-hot bit decode word 216 for logical address '8' is asserted on the multi-hot bit decode wordline 218.

In this example, the memory system 200 is designed to activate multiple memory rows 204(1)-204(N) in the memory array 206 for a memory access operation. For example, it may be desired for other memory rows 204(1)-204(N) other than the memory row 204(1)-204(N) corresponding to the encoded address 210 to automatically be accessed in response to a read operation. For example, if logical address '8' is provided as the encoded address 210 for a read operation, it may be desired for logical address '7' to also automatically be accessed from the memory array 206 as part of a read operation. There may be certain applications for which it is efficient to design the memory system 200 to access multiple memory rows 204(1)-204(N) automatically in response to a single memory access operation.

In this regard, the memory access control system 212 in FIG. 2 includes a mapping circuit 220. The mapping circuit 220 is configured to receive the single-hot bit decode word 216 and translate the single-hot bit decode word 216 into one or more additional single-hot bit decode words 222 corresponding to one or more other memory rows 204(1)-204(N) in the memory array 206 not located at the encoded address 210 to also be accessed. For example, the multi-hot bit decoding system 202 in FIG. 2 could be configured to translate the single-hot bit decode word 216 by shifting the single-hot bit decode word 216 by one address lower than the encoded address 210, as one non-limiting example. It may be desired to configure the mapping circuit 220 to shift the single-hot bit decode word 216 for translation into the additional single hot-bit decode word(s) 222 if the memory access control system 212 is configured to activate adjacent memory rows 204(1)-204(N) in the memory array 206 for a memory access operation. However, shifting for translation is not required. Other logic operations could be performed on or based on the single-hot bit decode word 216 to generate the additional single hot-bit decode word(s) 222 for access to other memory rows 204(1)-204(N), whether adjacent to each other or not.

In this regard, assuming an example of a shift translation by the mapping circuit 220 to activate another adjacent memory row 204(1)-204(N), consider the example of logical address '8' in FIG. 3. In this example, the mapping circuit 220 generates the additional single hot-bit decode word(s) 222 as decode word '7' ("$00010000000_2$") (i.e., entry for address '8' and entry-1). To allow memory rows 204(1)-204(N) corresponding to both addresses '7' and '8' in this example to be accessed in a memory access operation, a merge circuit 224 is provided in the memory access control system 212. The merge circuit 224 is configured to merge the single-hot bit decode word 216 and the additional single-hot bit decode word(s) 222 into a multi-hot bit decode word 226. In the example in FIG. 3 for the single-hot bit decode word 216 for logical address '8' and the additional single-hot bit decode word 222 for logical address '7,' the multi-hot bit decode word 226 is shown as "$00110000000_2$". The memory access control system 212 asserts the multi-hot bit decode word 226 onto the multi-hot bit decode wordline 218. In this regard, the memory row access circuits 208(1)-208(N) that are configured to activate based on hot bits being located in address locations '7' and '8' in the multi-hot bit decode wordline 218 will activate their corresponding memory rows 204(1)-204(N) such that both logical addresses '8' and '7' will be activated for the read operation. In one example, the memory row access circuits 208(1)-208(N) can be configured to activate their corresponding memory rows 204(1)-204(N) simultaneously, because the multi-hot bits are asserted onto the multi-hot bit decode wordline 218 as part of a multi-hot bit decode word 226 for a given memory access operation.

Thus, the multi-hot bit decoding system 202 in FIG. 2 is configured to activating multiple memory rows 204(1)-204(N) in the memory array 206 for a memory access operation. By providing the mapping circuit 220 and the merge circuit 224 in the memory access control system 212, which supports decoding for all memory rows 204(1)-204(N) in the memory array 206, the multi-hot bit decode word 226 can be generated. Thus, by providing the multi-hot bit decode word 226, additional logic and wire routing may be avoided for each memory row access circuit 208(1)-208(N) for tapping off of multiple single-hot bit wordlines for additional different combinations of decoded addresses. Additional logic may be avoided for each memory row access circuit 208(1)-208(N) even if a global single-hot bit decode wordline was provided, because in this instance, the memory row access circuit 208(1)-208(N) may have to include additional circuitry to tap off of the global single-hot bit wordline for additional different combinations of decoded words for physical addressing. The logic in the memory row access circuits 208(1)-208(N) in FIG. 2 only has to tap off of the multi-hot bit decode wordline 218 for the bit combinations that are designed to correspond to their respective memory rows 204(1)-204(N).

Figure 4:
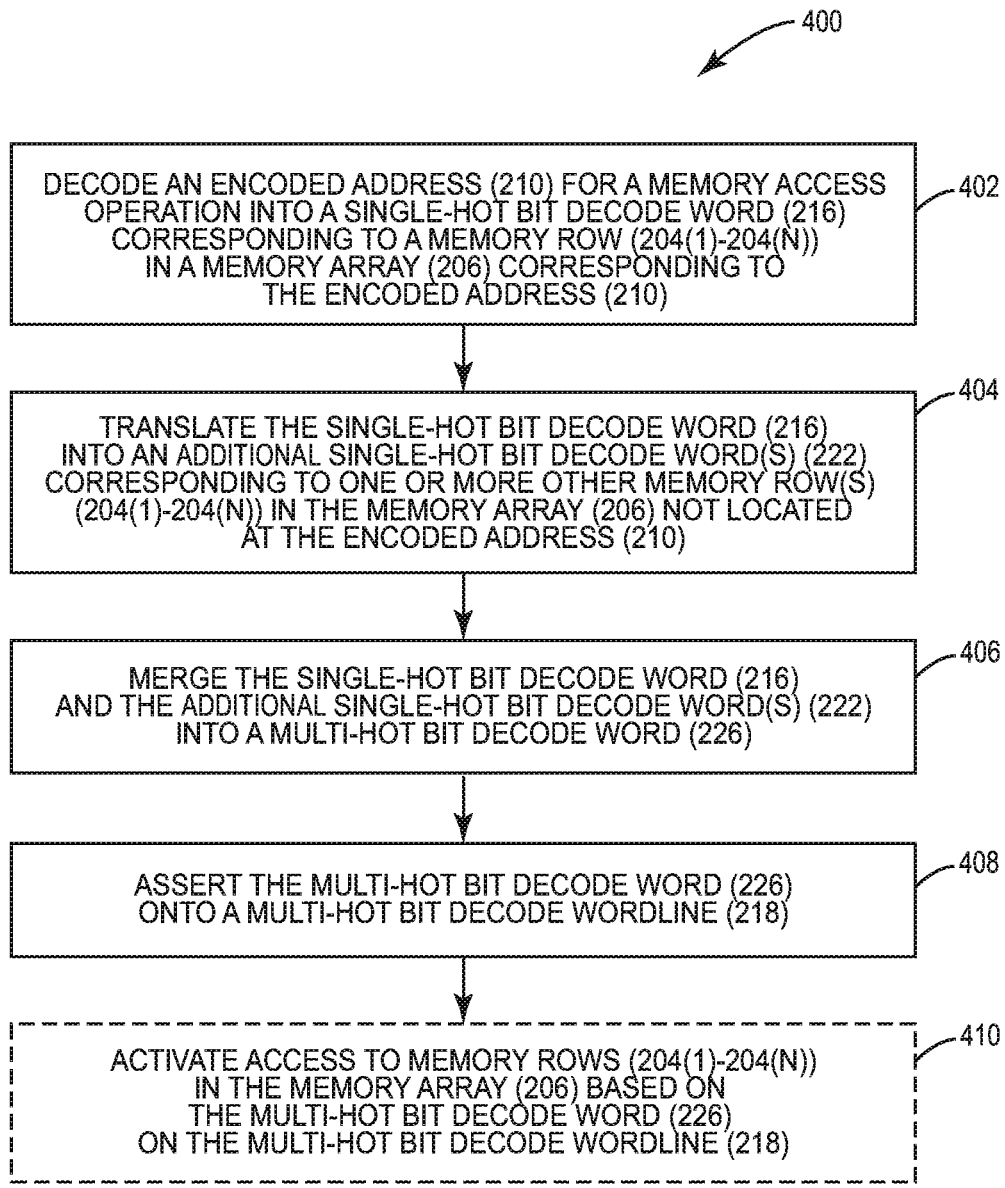
FIG. 4 is a flowchart illustrating an exemplary process of the multi-hot bit decoding system in FIG. 2 merging a single-hot bit decode word and an additional single-hot bit decode word(s) to form a multi-hot bit decode word for activating multiple memory rows in the memory for a memory access operation.

FIG. 4 is a flowchart illustrating an exemplary process 400 of the multi-hot bit decoding system 202 in FIG. 2 merging the single-hot bit decode word 216 and the additional single-hot bit decode word(s) 222 to form the multi-hot bit decode word 226 for activating multiple memory rows 204(1)-204(N) in the memory array 206 for a memory access operation. In this regard, the decoder 214 in the memory access control system 212 decodes an encoded address 210 for a memory access operation into the single-hot bit decode word 216 corresponding to a memory row 204(1)-204(N) in the memory array 206 corresponding to the encoded address 210 (block 402). The mapping circuit 220 in the memory access control system 212 translates the single-hot bit decode word 216 into one or more additional single hot-bit decode words 222 corresponding to one or more other memory rows 204(1)-204(N) in the memory array 206 not located at the encoded address 210 (block 404). The merge circuit 224 in the memory access control system 212 merges the single-hot bit decode word 216 and the one or more additional single-hot bit decode words 222 into the multi-hot bit decode word 226 (block 406). The memory access control system 212 asserts the multi-hot bit decode word 226 onto a multi-hot bit decode wordline 218 (block 408). Memory row access circuits 208(1)-208(N) configured to be activated based on the single-hot bit decode word 216 and the additional single-hot bit decode word(s) 222 activate access to their corresponding memory rows 204(1)-204(N) in the memory array 206 based on the multi-hot bit decode word 226 on the multi-hot bit decode wordline 218 (block 410). The memory row access circuits 208(1)-208(N) may be part of the multi-hot bit decoding system 202 as shown in FIG. 2, or may be provided in a separate system from the memory access control system 212 and configured to access the multi-hot bit decode wordline 218. For example, the memory row access circuits 208(1)-208(N) may be provided on-chip with a memory array 206, which is provided off-chip with the memory access control system 212.

Figure 5:
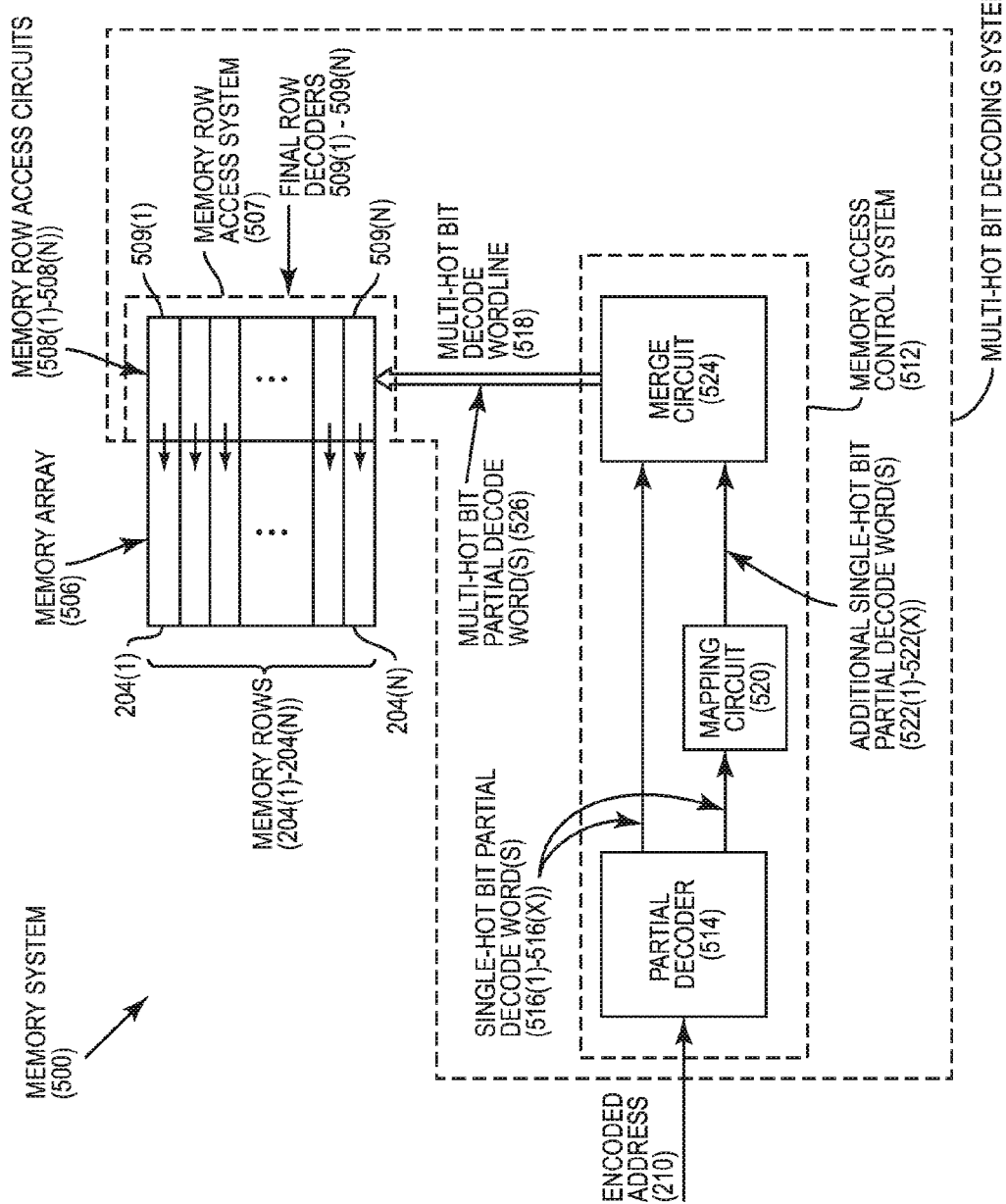
FIG. 5 is a block diagram of another exemplary memory system employing a multi-hot bit decoding system employing a partial decoding system for generating a multi-hot bit partial decode word for activating multiple memory rows in a memory for a memory access operation.

FIG. 5 is a block diagram of another exemplary memory system 500 employing another exemplary multi-hot bit decoding system 502. The multi-hot bit decoding system 502 in FIG. 5 is configured to partially decode an encoded address 210 for activating multiple memory rows 204(1)-204(N) in a memory for a memory access operation. Partial decoding of the encoded address 210 may be employed if the memory size is such that it is not feasible or desired for the logic circuits 116(1)(1)-116(N)(2) in memory row access circuits 508(1)-508(N) provided in the form of final row decoders 509(1)-509(N) to decode multiple single-hot bit decode words. Common elements between the memory system 500 in FIG. 5 and the memory system 200 in FIG. 2 are shown with common element numbers and thus will not be re-described.

As illustrated in FIG. 5, the multi-hot bit decoding system 502 includes a memory access control system 512. The memory access control system 512 decodes the encoded address 210 as part of a memory access operation for accessing any of the memory rows 204(1)-204(N) in a memory array 506. The memory access control system 512 includes a partial decoder 514. The partial decoder 514 is configured to receive the encoded address 210 and partially decode the encoded address 210 into one or more single-hot bit partial decode words 516(1)-516(X) corresponding to a memory row 204(1)-204(N) in the memory array 506.

Figure 6:
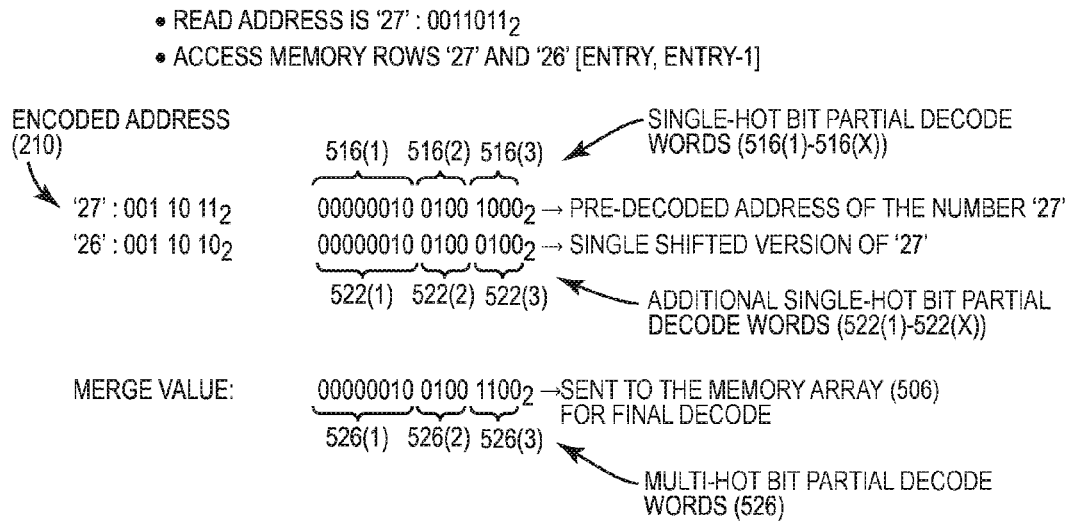
FIG. 6 illustrates an exemplary encoded address, partially decoded into a single-hot bit partial decode word and translated to form an additional single-hot bit partial decode word(s) in the multi-hot bit decoding system in FIG. 5 to generate a multi-hot bit partial decode word for activating multiple memory rows in the memory for a memory access operation.

For example, as shown in FIG. 6, if the encoded address 210 is address '27' ("0011011$_2$"), the partial decoder 514 in this example decodes the encoded address 210 into three (3) separate single-hot bit partial decode words 516(1)-516(3)—"00000010 0100 1000$_2$", which are unique subsets of bits of the encoded address 210 in this example. The first three (3) bits of address '27,' which is "001$_2$", are partially decoded into the first single-hot bit partial decode word 516(1): "00000010$_2$". The next two (2) bits of address '27,' which is "10$_2$", are partially decoded into the second single-hot bit partial decode word 516(2): "0100$_2$". The next two (2) bits of address '27,' which is "11$_2$", are partially decoded into the third single-hot bit partial decode word 516(3): "1000$_2$". In this manner, if only the memory row 204(1)-204(N) at address '27' were to be accessed in the memory array 506, the single-hot bit partial decode words 516(1)-516(3) could be asserted onto a multi-hot bit decode wordline 518. A memory row access system 507 is provided in the memory array 506 to control access to the memory rows 204(1)-204(N) for a memory access operation (i.e., read and write operations). In this example, the memory row access system 507 comprises a plurality of final row decoders 509(1)-509(N) provided for each memory row 204(1)-204(N). The final row decoders 509(1)-509(N) each include a logic circuit(s) that taps off of the multi-hot bit decode wordline 518 according to the decoded version of the encoded address 210, and are configured to activate a corresponding memory row 204(1)-204(N) for the memory access operation. For example, if physical memory row 204(4) in the memory array 506 is designed in the memory system 500 to correspond to logical address '27,' the final row decoder 509(4) contains a logic circuit(s) that is designed to activate the corresponding memory row 204(4) if the single-hot bit partial decode words 516(1)-516(3) for encoded address '27' are asserted on the multi-hot bit decode wordline 518.

Also in this example, the memory system 500 is designed to activate multiple memory rows 204(1)-204(N) in the memory array 506 for a memory access operation. For example, if the memory system 500 is configured to automatically access the encoded address 210 minus one (1) address, for logical address '27,' logical address '26' is also accessed from the memory array 506 as part of a read operation. In this regard, the memory access control system 512 in FIG. 5 includes a mapping circuit 520. The mapping circuit 520 is configured to receive the single-hot bit partial decode words 516(1)-516(X) and translate the single-hot bit partial decode words 516(1)-516(X) into additional single-hot bit partial decode words 522(1)-522(X) corresponding to one or more other memory rows 204(1)-204(N) in the memory array 506 not located at the encoded address 210 to also be accessed. For example, the multi-hot bit decoding system 502 in FIG. 5 could be configured to translate the single-hot bit partial decode words 516(1)-516(X) into the respective additional single-hot bit partial decode words 522(1)-522(X) by shifting the single-hot bit partial decode words 516(1)-516(X) by one (1) address lower than the encoded address 210.

In this regard, in the example of shifting encoded address '27,' as shown in FIG. 6, the mapping circuit 520 would generate the additional single hot-bit partial decode words 522(1)-522(3) as partial decode word '26': "00000010 0100 0100$_2$" (i.e., entry for address '26' and entry-1). In this example, the mapping circuit 520 right shifts the single hot-bit partial decode words 516(1)-516(3) by one (1) bit, because the multi-hot bit decoding system 502 is configured to automatically access the preceding logical address of the encoded address 210 (i.e., entry-1). To allow memory rows 204(1)-204(N) corresponding to both addresses '27' and '26' in this example to be accessed in a memory access operation, a merge circuit 524 is provided in the memory access control system 512. The merge circuit 524 is configured to merge the single-hot bit partial decode words 516(1)-516(X) and the additional single-hot bit partial decode words 522(1)-522(X) into multi-hot bit partial decode words 526. Thus, in the example in FIG. 6 for three (3) single-hot bit partial decode words 516(1)-516(3) for logical address '27' and the additional single-hot bit partial decode words 522(1)-522(3) for logical address '26,' multi-hot bit partial decode words 526(1)-526(3) are shown as '00000010 0100 1100$_2$'. The memory access control system 512 asserts the multi-hot bit partial decode words 526 onto the multi-hot bit decode wordline 518. In this regard, the final row decoders 509(1)-509(N) each include final decoding logic that taps off one wordline (i.e., one (1) hot bit) in the multi-hot bit decode wordline 518 for each multi-hot bit partial decode word 526 to activate their respective memory row 204(1)-204(N). Thus, in this example, when address '27' is the encoded address 210 for a read operation, the multi-hot bit partial decode words 526(1)-526(3) of '00000010 0100 1100$_2$' are tapped by the final row decoders 509(1)-509(N) such that final row decoders 509(26) and 509(27) activate their respective memory rows 204(26) and 204(27) in the memory array 506. In one example, the final row decoders 509(1)-509(N) can be configured to activate their corresponding memory rows 204(1)-204(N) simultaneously, because the multi-hot bits are asserted onto the multi-hot bit decode wordline 518 to form the multi-hot bit decode words 526 for a given memory access operation.

When the multi-hot bit partial decode words 526 generated in the multi-hot bit decoding system 502 in FIG. 5 are fully decoded by the final row decoders 509(1)-509(N), decode words will be generated that are intended and legal, as well as decode words that are unintended and illegal. The unintended results can cause memory rows 204(1)-204(N) to be activated in response to a read operation that should not be activated. Thus, it may be desired to configured the multi-hot bit decoding system 502 to issue a block command on block wordlines that can be additionally tapped by the final row decoders 509(1)-509(N) to prevent the final row decoders 509(1)-509(N) from activating illegal memory rows 204(1)-204(N) for a read operation.

Figure 7:
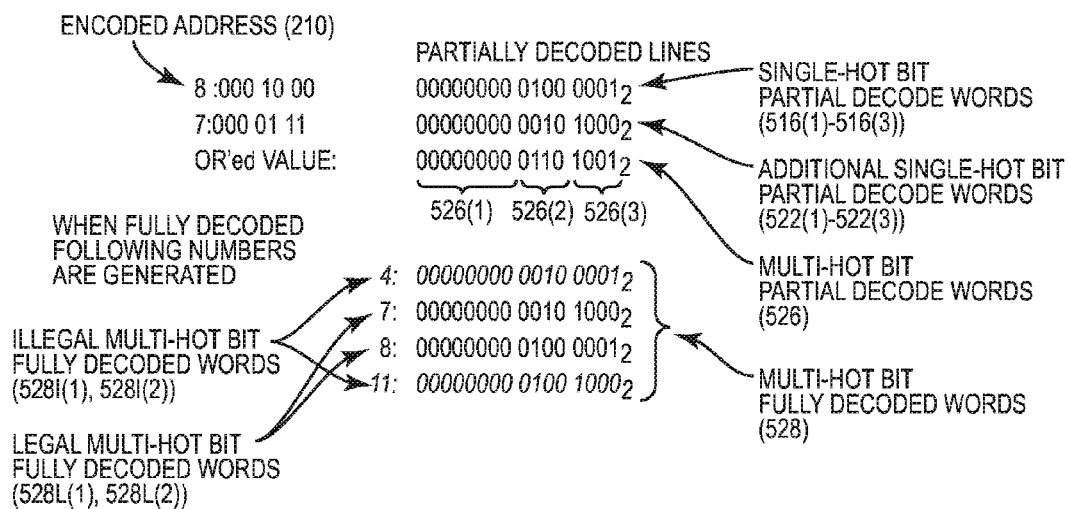
FIG. 7 illustrates legal and illegal memory row activation combinations in multi-hot bit fully decoded words.

To explain this concept in more detail, FIG. 7 is provided. FIG. 7 shows an example of legal and illegal multi-hot bit fully decoded words 528 generated from multi-hot bit partial decode words 526 generated by the multi-hot bit decoding system 502 in FIG. 5 as a result of an encoded address 210 of '8.' In this example, the partial decoder 514 in FIG. 5 generates the single-hot bit partial decode word 516(1)-516(3) of '00000000 0100 0001$_2$', as shown in FIG. 7. The mapping circuit 520 in FIG. 5 generates the additional single-hot bit partial decode word 522(1)-522(3) of "00000000 0010 1000$_2$", as shown in FIG. 7. Because address '8' is a corner address according to the partitioning of the multi-hot bit partial decode words 526(1)-526(3), to generate address '7,' the mapping circuit 520 shifts the hot bit in the second multi-hot bit partial decode word 526(2) from '0100$_2$' to '0010$_2$,' and generates the third multi-hot bit partial decode word 526(3) as '1000$_2$.' The merge circuit 524 generates the multi-hot bit partial decode word 526(1)-526(3) of "00000000 0110 1001$_2$".

When the multi-hot bit partial decode word 526(1)-526(3) of "00000000 0110 1001$_2$" is fully decoded in this example, the following multi-hot bit fully decoded words 528 are possible: 4 ('00000000 0010 0001$_2$'), 7 (00000000 0010 1000$_2$", 8 (00000000 0100 0001$_2$"), and 11 (00000000 0100 1000$_2$"), as shown in FIG. 7. This results from the second multi-hot bit partial decode word 526(2) of "0110$_2$" generating two (2) possible single-hot bit partial decode words 516(1)-516(2) of "0010$_2$" and "0100$_2$", and the third multi-hot bit partial decode word 526(3) of "1001$_2$" generating two (2) possible single-hot bit partial decode words 516(1)-516(2) of "1000$_2$" and "0001$_2$", as shown in FIG. 7. However in this example, only multi-hot bit fully decoded words 7 (00000000 0010 1000$_2$"), 8 (00000000 0100 0001$_2$") 528 are legal (legal multi-hot bit fully decoded words 528L(1), 528L(2)), meaning these two (2) multi-hot bit fully decoded words are the only words in this example intended for the memory rows 204(1)-204(N), corresponding to the encoded address 210 of '8' and logical address '7' to be activated. Multi-hot bit fully decoded words 4 ('00000000 0010 0001$_2$") and 11 (00000000 0100 1000$_2$") 528 are illegal (illegal multi-hot bit fully decoded words 528I(1), 528I(2)), meaning these two (2) multi-hot bit fully decoded words in this example are not intended to be used to access memory rows 204(1)-204(N) corresponding to the encoded address 210 of '4' and logical address '11'. Thus, the illegal multi-hot bit fully decoded words 528I(1), 528I(2) for '4' and '11' in this example can be blocked, as discussed above with regard to FIG. 5 and below with regard to FIG. 8 for example, such that the final row decoders 509(1)-509(N) do not activate memory rows 204(1)-204(N) corresponding to logical addresses '4' and '11.'

Figure 8:
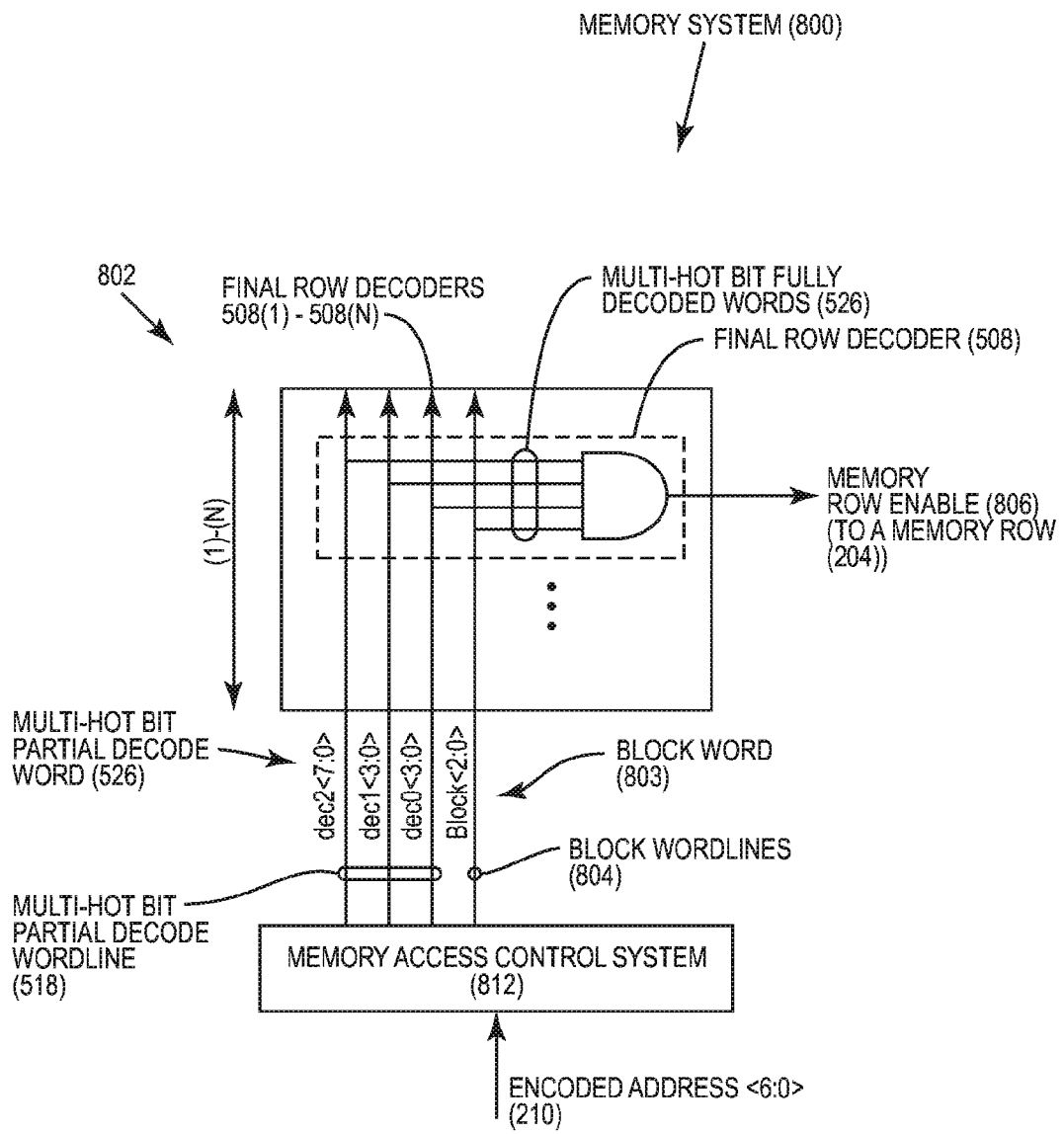
FIG. 8 illustrates another exemplary multi-hot bit decoding system configured to generate a multi-hot bit partial decode word for activating multiple memory rows in a memory for a memory access operation and blocking illegal memory row activation combinations.

In this regard, FIG. 8 illustrates another exemplary memory system 800 that includes another exemplary memory access control system 812 that can be provided in a multi-hot bit decoding system 802. Like the memory access control system 512 in FIG. 5, the memory access control system 812 in FIG. 8 is configured to generate the multi-hot bit partial decode word 526 for activating multiple memory rows 204(1)-204(N) in the memory array 506. Common elements between the multi-hot bit decoding system 502 in FIG. 5 and the multi-hot bit decoding system 802 in FIG. 8 are shown with common element numbers in FIG. 8, and thus will not be re-described. However, the multi-hot bit decoding system 802 in FIG. 8 is configured to generate a block word 803 on block wordlines 804 to indicate illegal decode word combinations that would result from fully decoding the multi-hot bit partial decode word 526. In this regard, as shown in FIG. 8, a final row decoder 509 can additionally tap off of the block wordlines 804 to control whether a memory row enable signal 806 is generated to activate a memory row 204 corresponding to the final row decoder 509. For the example in FIG. 7 discussed above, the multi-hot bit decoding system 812 would generate a three (3) bit block word 803 (Block<2:0>) to block illegal combinations of decode words in the final row decoders 509(1)-509(N).

Figure 9:
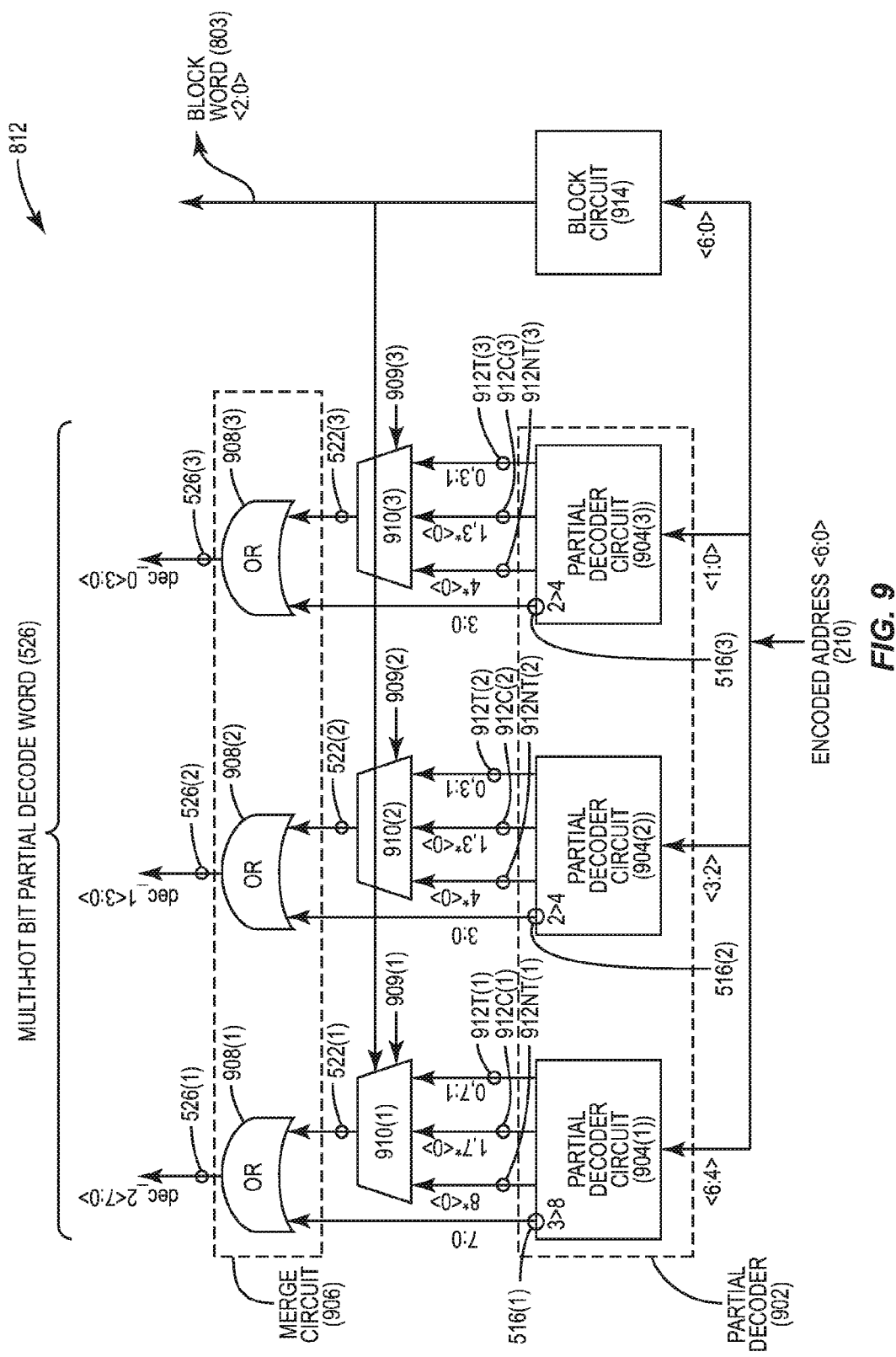
FIG. 9 is a block diagram of an exemplary memory access control system that can be provided in the multi-hot bit decoding system in FIG. 8, wherein the memory access control system is configured to generate a multi-hot bit partial decode word for activating multiple memory rows in a memory for a memory access operation and blocking illegal memory row activation combinations.

FIG. 9 is a block diagram of an example of the memory access control system 812 in the multi-hot bit decoding system 802 in FIG. 8. The memory access control system 812 in FIG. 9 is configured to partially decode a seven (7) bit encoded address 210 (<6:0>) into three (3) single-hot bit partial decode words 516(1)-516(3) of eight (8) bits <7:0>, four (4) bits <3:0> and four (4) bits <3:0>, respectively. The memory access control system 812 is also configured to provide additional single-hot bit partial decode words 522(1)-522(3) from the single-hot bit partial decode words 516(1)-516(3) and handle corner cases. The memory access control system 812 is also configured to provide the block word 803.

In this regard, the memory access control system 812 includes a partial decoder 902 that is comprised of three (3) separate partial decoder circuits 904(1)-904(3). The partial decoder circuits 904(1)-904(3) are configured to receive the encoded address 210 and partially decode the encoded address 210 into the single-hot bit partial decode words 516(1)-516(3). The partial decoder circuit 904(1) is a 3>8 decoder. The partial decoder circuit 904(2) is a 2>4 decoder. The partial decoder circuit 904(3) is a 2>4 decoder. The partial decoder circuits 904(1)-904(3) are each configured to provide their respective generated single-hot bit partial decode words 516(1)-516(3) to a merge circuit 906. The merge circuit 906 is comprised of three (3) separate merge logic circuits 908(1)-908(3), which are OR-based logic gates in this example. The merge logic circuits 908(1)-908(3) are each configured to merge the single-hot bit partial decode words 516(1)-516(3) with the respective additional single-hot bit partial decode words 522(1)-522(3) to provide the multi-hot bit partial decode words 526 (e.g., multi-hot bit partial decode words 526(1)-526(3) in FIG. 7) to be provided to the final row decoders 509(1)-509(N) (see FIGS. 5 and 8).

With continuing reference to FIG. 9, to generate the additional single-hot bit partial decode words 522(1)-522(3), the memory access control system 812 includes three (3) multiplexor circuits 910(1)-910(3). Each of the multiplexor circuits 910(1)-910(3) is configured to generate the additional single-hot bit partial decode words 522(1)-522(3) based on different outputs from the partial decoder circuits 904(1)-904(3) to account for different cases of additional partial decoding of the single-hot bit partial decode words 516(1)-516(3). For example, using partial decoder circuit 904(3) as an example, the partial decoder circuit 904(3) is configured to generate a translate output 912T(3) of the single-hot bit partial decode word 516(3). The partial decoder circuit 904(3) is also configured to generate a corner output 912C(3) of the single-hot bit partial decode word 516(3) when a most significant bit (MSB) is hot, which is a corner case. The partial decoder circuit 904(3) is also configured to generate a non-translate output 912NT(3) when the single-hot bit partial decode word 516(3) should not be translated in certain cases when upper single-hot bit partial decode words 516(1) or 516(2) are translated. The translate output 912T(3), the corner output 912C(3), and the non-translate output 912NT(3) are input into a respective selector circuit 909(3) provided in the form of a multiplexor circuit 910(3) in this example to pass one such output to a respective merge logic circuit 908(3) to be merged with the single-hot bit partial decode word 516(3). The partial decoder circuits 904(1), 904(2) are similarly configured to generate their respective translate outputs 912T(1), 912T(2), corner outputs 912C(1) 912C(2), and non-translate outputs 912NT(1), 912NT(2) to selector circuits 909(1), 909(2) also provided in the form of multiplexor circuits 910(1), 910(2) in this example. The memory access control system 812 also includes a block circuit 914. The block circuit 914 is configured to receive the encoded address 210 and generate the block word 803 based on the illegal combinations of the decode words for the final row decoders 509(1)-509(N). The multi-hot bit partial decode word 526 and block word 803 are provided to the final row decoders 509(1)-509(N) (see FIG. 5) to activate physical memory rows 204(1)-204(N) based on the logical encoded address 210 and other logical addresses to automatically be accessed based on the encoded address 210, as previously discussed.

Note that for other examples of the multi-hot bit partial decode word 526, other corner output cases and non-translate output cases will result in generating other combinations of legal and illegal multi-hot bit fully decoded words 526L, 526I. These cases will depend not only on the bit width of the encoded address 210, but also on combination of multi-hot bit partial decode words 526 generated as a result of the partial decoding scheme employed. This includes the number of partial decoding schemes used to partially decode the encoded address 210, as well as the bit width of partial decoder circuits, like the partial decoder circuits 904(1)-904(3) shown and discussed above with regard to FIG. 9 as an example. Thus, the present disclosure is not limited to the particular examples of multi-hot bit partial decode words 526, nor their resulting legal and illegal multi-hot bit fully decoded words 526L, 526I.

Multiple-hot (multi-hot) bit decoding in a memory system for activating multiple memory locations in a memory for a memory access operation according to aspects disclosed herein, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 10:
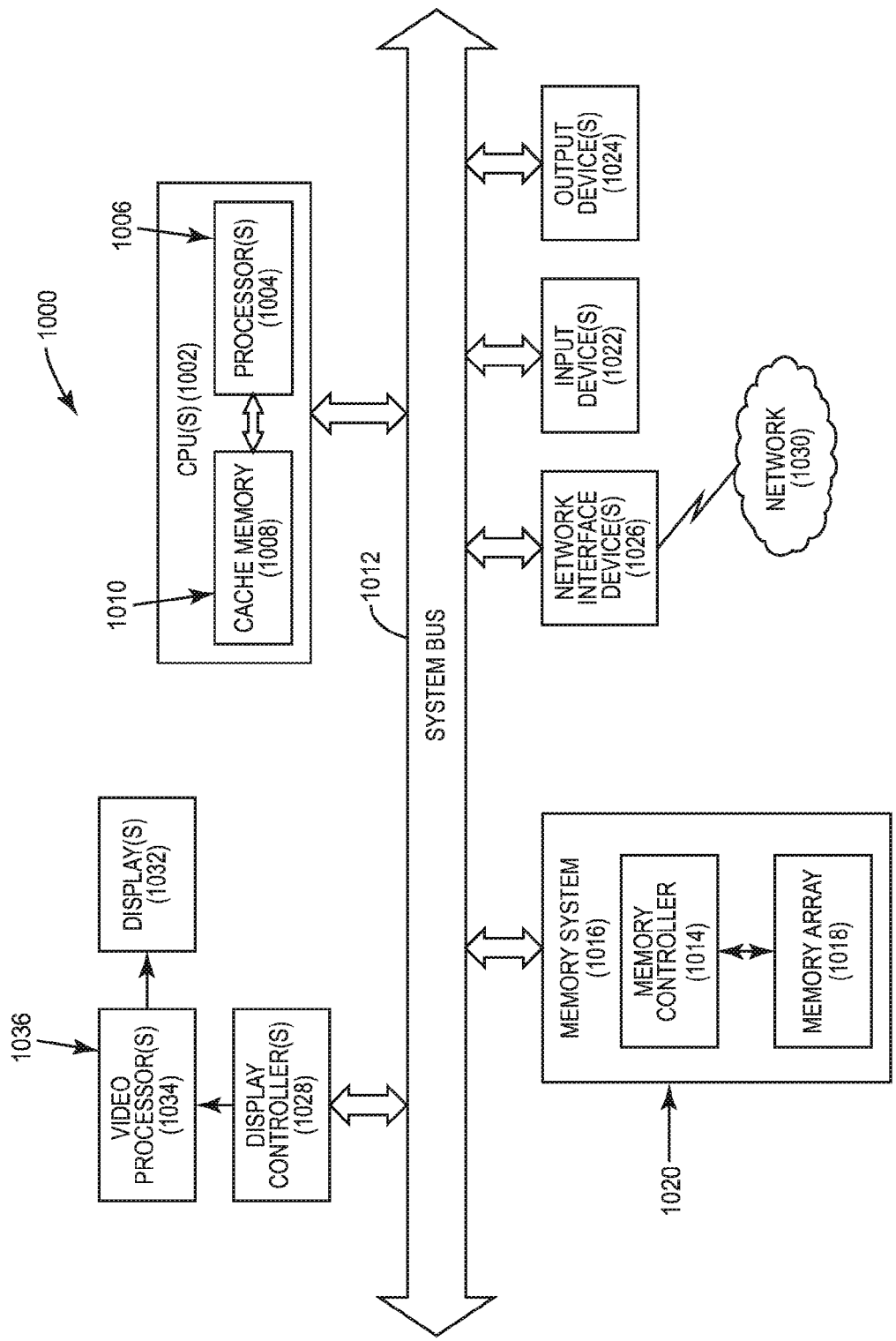
FIG. 10 is a block diagram of an exemplary processor-based system that includes one or more memory systems each employing a multi-hot bit decoding system for activating multiple memory rows in a memory for a memory access operation.

In this regard, FIG. 10 illustrates an example of a processor-based system 1000 that includes one or more memory systems each employing a multi-hot bit decoding system for activating multiple memory rows in a memory for a memory access operation, which may be according to any of the particular aspects discussed above. In this example, the processor-based system 1000 includes a central processing unit(s) (CPU) 1002 that includes one or more processors 1004, also known as processing units. A memory system 1006 employing a multi-hot bit decoding system according to any of the aspects disclosed herein could be included in any of the processors 1004. The CPU 1002 may have a cache memory 1008 coupled to the processors 1004 for rapid access to temporarily stored data. The cache memory 1008 can include a multi-hot bit decoding system 1010 according to any of the aspects disclosed herein. The CPU 1002 is coupled to a system bus 1012 and can intercouple peripheral devices included in the processor-based system 1000. The CPU 1002 communicates with these other devices by exchanging address, control, and data information over the system bus 1012. Although not illustrated in FIG. 10, multiple system buses 1012 could be provided, wherein each system bus 1012 constitutes a different fabric. For example, the CPU 1002 can communicate bus transaction requests to a memory controller 1014 in a memory system 1016 as an example of a slave device. In this example, the memory controller 1014 is configured to provide memory access operations to a memory array 1018 in the memory system 1016. The memory system 1016 can include a multi-hot bit decoding system 1020 according to any of the aspects disclosed herein.

Other devices can be connected to the system bus 1012. As illustrated in FIG. 10, these devices can include the memory system 1016, one or more input devices 1022, one or more output devices 1024, one or more network interface devices 1026, and one or more display controllers 1028, as examples. The input device(s) 1022 can include any type of input device, including but not limited to input keys, switches, voice processors, etc. The output device(s) 1024 can include any type of output device, including but not limited to audio, video, other visual indicators, etc. The network interface device(s) 1026 can be any devices configured to allow exchange of data to and from a network 1030. The network 1030 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

The CPU 1002 may also be configured to access the display controller(s) 1028 over the system bus 1012 to control information sent to one or more displays 1032. The display(s) 1032 can include any type of display, including but not limited to a cathode ray tube (CRT), a liquid crystal display (LCD), a plasma display, etc. The display controller(s) 1028 sends information to the display(s) 1032 to be displayed via one or more video processors 1034, which process the information to be displayed into a format suitable for the display(s) 1032. The video processor 1034 can also include a multi-hot bit decoding system 1036 according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multiple-hot (multi-hot) bit decoding system for activating memory locations in a memory for a memory access operation, comprising:
    a decoder configured to receive an encoded address for a memory access operation and decode the encoded address into a single-hot bit decode word corresponding to a memory row among a plurality of memory rows in a memory array corresponding to the encoded address;
    a mapping circuit configured to translate the single-hot bit decode word into one or more additional single-hot bit decode words corresponding to one or more other memory rows among the plurality of memory rows in the memory array not corresponding to the encoded address; and
    a merge circuit configured to merge the single-hot bit decode word and the one or more additional single-hot bit decode words into a multi-hot bit decode word asserted onto a multi-hot bit decode wordline configured to be accessed by a memory row access system to activate two or more memory rows among the plurality of memory rows based on the multi-hot bit decode word on the multi-hot bit decode wordline.

2. The multi-hot bit decoding system of claim 1, wherein:
    the decoder is comprised of a partial decoder configured to partially decode the encoded address into one or more single-hot bit partial decode words corresponding to the memory row among the plurality of memory rows in the memory array;
    the mapping circuit is configured to receive the one or more single-hot bit partial decode words and translate the one or more single-hot bit partial decode words into one or more additional single-hot bit partial decode words corresponding to the one or more other memory rows among the plurality of memory rows in the memory array not located at the encoded address; and
the merge circuit is configured to merge the one or more single-hot bit partial decode words and the one or more additional single-hot bit partial decode words into a multi-hot bit partial decode word asserted onto the multi-hot bit decode wordline.

3. The multi-hot bit decoding system of claim 2, further comprising the memory row access system coupled to the multi-hot bit decode wordline, the memory row access system configured to activate the two or more memory rows among the plurality of memory rows based on the multi-hot bit partial decode word on the multi-hot bit decode wordline.

4. The multi-hot bit decoding system of claim 3, comprising:
the memory array comprising the memory row access system; and
a memory access control system comprising the decoder, the mapping circuit, and the merge circuit configured to assert the multi-hot bit partial decode word onto the multi-hot bit decode wordline to be received by each of the plurality of memory rows.

5. The multi-hot bit decoding system of claim 2, further comprising a plurality of memory row access circuits comprising a plurality of final row decoders each configured to activate access to a respective memory row among the plurality of memory rows in the memory array based on the multi-hot bit partial decode word on the multi-hot bit decode wordline.

6. The multi-hot bit decoding system of claim 5, wherein the plurality of final row decoders are each configured to generate at least one multi-hot bit fully decoded word to activate access to the respective memory row among the plurality of memory rows in the memory array based on the multi-hot bit partial decode word on the multi-hot bit decode wordline.

7. The multi-hot bit decoding system of claim 2, wherein the partial decoder comprises a plurality of partial decoder circuits each configured to:
receive a unique subset of bits of the encoded address;
decode the unique subset of bits of the encoded address into a single hot-bit partial decode word among the one or more single-hot bit partial decode words; and
decode the unique subset of bits of the encoded address into an additional single-hot bit partial decode word among the one or more additional single-hot bit partial decode words.

8. The multi-hot bit decoding system of claim 7, wherein the merge circuit is configured to merge the single-hot bit partial decode word and the additional single-hot bit partial decode word into the multi-hot bit partial decode word by being configured to:
receive the one or more single-hot bit partial decode words from the respective plurality of partial decoder circuits;
receive the one or more additional single-hot bit partial decode words from the respective plurality of partial decoder circuits; and
merge the one or more single-hot bit partial decode words and the one or more additional single-hot bit partial decode words into the multi-hot bit partial decode word.

9. The multi-hot bit decoding system of claim 8 configured to generate a multi-hot bit fully decoded word comprising at least one legal multi-hot bit fully decoded word and at least one illegal multi-hot bit fully decoded word.

10. The multi-hot bit decoding system of claim 9, further comprising a block circuit configured to generate a block word on block wordlines indicating at least one illegal decode word in the multi-hot bit fully decoded word.

11. The multi-hot bit decoding system of claim 10, wherein the plurality of partial decoder circuits are each further configured to generate:
a translate output based on a translation of the single-hot bit partial decode word;
a corner output when a most significant bit (MSB) of the respective decoded single hot-bit partial decode word is hot; and
a non-translate output when the respective decoded single-hot bit partial decode word should not be translated; and
further comprising a plurality of selector circuits each configured to:
receive the translate output from a respective partial decoder circuit among the plurality of partial decoder circuits;
receive the corner output from the respective partial decoder circuit among the plurality of partial decoder circuits;
receive the non-translate output from the respective partial decoder circuit among the plurality of partial decoder circuits; and
provide a selected one of the translate output, the corner output, and the non-translate output to the merge circuit based on the block word on the block wordlines.

12. The multi-hot bit decoding system of claim 2, wherein:
the mapping circuit is configured to translate the one or more additional single-hot bit decode words by being configured to shift the single-hot bit decode word into one or more shifted single-hot bit decode words corresponding to the one or more other memory rows among the plurality of memory rows in the memory array not corresponding to the encoded address; and
the merge circuit is configured to merge the single-hot bit decode word and the one or more shifted single-hot bit decode words by being configured to merge the one or more single-hot bit partial decode words and the one or more additional single-hot bit partial decode words into the multi-hot bit decode word asserted onto the multi-hot bit decode wordline.

13. The multi-hot bit decoding system of claim 1, further comprising the memory row access system coupled to the multi-hot bit decode wordline, the memory row access system configured to activate the two or more memory rows among the plurality of memory rows based on the multi-hot bit decode word on the multi-hot bit decode wordline.

14. The multi-hot bit decoding system of claim 13, comprising:
the memory array comprising the memory row access system; and
a memory access control system comprising the decoder, the mapping circuit, and the merge circuit configured to assert the multi-hot bit decode word onto the multi-hot bit decode wordline to be received by each of the plurality of memory rows.

15. The multi-hot bit decoding system of claim 1, wherein:
the mapping circuit is configured to shift the single-hot bit decode word into one or more shifted single-hot bit decode words corresponding to the one or more other memory rows among the plurality of memory rows in the memory array not corresponding to the encoded address; and the merge circuit is configured to merge the single-hot bit decode word and the one or more shifted single-hot bit decode words into the multi-hot bit decode word asserted onto the multi-hot bit decode wordline.

16. A multiple-hot (multi-hot) bit decoding system for activating memory locations in a memory for a memory access operation, comprising:

means for receiving an encoded address for a memory access operation;

means for decoding the encoded address into a single-hot bit decode word corresponding to a memory row among a plurality of memory rows in a memory array corresponding to the encoded address;

means for translating the single-hot bit decode word into one or more additional single-hot bit decode words corresponding to one or more other memory rows among the plurality of memory rows in the memory array not corresponding to the encoded address; and means for merging the single-hot bit decode word and the one or more additional single-hot bit decode words into a multi-hot bit decode word asserted onto a multi-hot bit decode wordline to be accessed to activate two or more memory rows among the plurality of memory rows in the memory array based on the multi-hot bit decode word on the multi-hot bit decode wordline.

17. A method for activating multiple memory locations in a memory for a memory access operation, comprising:

decoding an encoded address for a memory access operation into a single-hot bit decode word corresponding to a memory row in a memory array corresponding to the encoded address;

translating the single-hot bit decode word into one or more additional single-hot bit decode words corresponding to one or more other memory rows in the memory array not located at the encoded address;

merging the single-hot bit decode word and the one or more additional single-hot bit decode words into a multi-hot bit decode word; and asserting the multi-hot bit decode word onto a multi-hot bit decode wordline to be activated to access to a plurality of memory rows in the memory array based on the multi-hot bit decode word on the multi-hot bit decode wordline.

18. The method of claim 17, wherein:

decoding the encoded address comprises partially decoding the encoded address into one or more single-hot bit partial decode words corresponding to the memory row in the memory array; and comprising:

translating the one or more single-hot bit partial decode words into one or more additional single-hot bit partial decode words corresponding to the one or more other memory rows in the memory array not located at the encoded address; and merging the one or more single-hot bit partial decode words and the one or more additional single-hot bit partial decode words into a multi-hot bit partial decode word asserted onto the multi-hot bit decode wordline.

19. The method of claim 18, further comprising activating access to the plurality of memory rows in the memory array based on the multi-hot bit partial decode word on the multi-hot bit decode wordline.

20. The method of claim 18, comprising activating access to a respective memory row among the plurality of memory rows in the memory array based on the multi-hot bit partial decode word on the multi-hot bit decode wordline.

21. The method of claim 18, wherein partially decoding the encoded address comprises:

receiving a plurality of a unique subset of bits of the encoded address;

decoding the respective plurality of the unique subset of bits of the encoded address into a plurality of single-hot bit partial decode words; and decoding the respective plurality of the unique subset of bits of the encoded address into a plurality of additional single-hot bit partial decode words.

22. The method of claim 21, wherein merging the single-hot bit partial decode word and the one or more additional single-hot bit partial decode words into the multi-hot bit partial decode word comprises:

receiving the one or more single-hot bit partial decode words from a plurality of partial decoder circuits;

receiving the one or more additional single-hot bit partial decode words from the respective plurality of partial decoder circuits; and merging the one or more single-hot bit partial decode words and the one or more additional single-hot bit partial decode words into the multi-hot bit partial decode word.

23. The method of claim 22, wherein activating access to the plurality of memory rows in the memory array comprises generating a multi-hot bit fully decoded word comprising at least one legal multi-hot bit fully decoded word and at least one illegal multi-hot bit fully decoded word, based on the multi-hot bit partial decode word; and further comprising generating a block word on block wordlines indicating at least one illegal decode word in the multi-hot bit fully decoded word.

24. The method of claim 17, further comprising activating access to the plurality of memory rows in the memory array based on the multi-hot bit decode word on the multi-hot bit decode wordline.

* * * * *